(12) United States Patent
Okuda et al.

(10) Patent No.: US 7,868,413 B2
(45) Date of Patent: Jan. 11, 2011

(54) SEMICONDUCTOR DEVICE

(75) Inventors: Takashi Okuda, Tokyo (JP); Toshio Kumamoto, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 202 days.

(21) Appl. No.: 12/267,166

(22) Filed: Nov. 7, 2008

(65) Prior Publication Data
US 2009/0127713 A1    May 21, 2009

(30) Foreign Application Priority Data
Nov. 16, 2007   (JP) .............................. 2007-297735

(51) Int. Cl.
*H01L 21/762* (2006.01)
(52) U.S. Cl. ............... 257/508; 257/E21.642; 257/392; 257/501; 257/773; 438/348; 438/361
(58) Field of Classification Search ........... 257/E23.01, 257/E21.544, E21.574, E21.642, 314, 391, 257/392, 501, 508, 773; 438/348, 361, 618, 438/666
See application file for complete search history.

(56) References Cited

U.S. PATENT DOCUMENTS

| | | | | |
|---|---|---|---|---|
| 6,534,819 | B2* | 3/2003 | Tiwari et al. ................. | 257/314 |
| 6,657,882 | B2* | 12/2003 | Takashima .................. | 365/145 |
| 6,724,046 | B2* | 4/2004 | Oyamatsu ................... | 257/347 |
| 6,947,830 | B1* | 9/2005 | Froloff et al. ............... | 701/111 |
| 7,547,871 | B2* | 6/2009 | Hiyama et al. ........... | 250/208.1 |
| 7,652,344 | B2* | 1/2010 | Uchida ....................... | 257/508 |
| 7,714,606 | B2* | 5/2010 | Ozawa et al. ................. | 326/30 |
| 2004/0213123 | A1* | 10/2004 | Takahashi et al. ........ | 369/59.19 |
| 2006/0012003 | A1* | 1/2006 | Mallikarjunaswamy et al. .. | 257/501 |
| 2006/0102980 | A1* | 5/2006 | Nakashiba ................... | 257/508 |
| 2006/0165341 | A1* | 7/2006 | Yan et al. ....................... | 385/8 |

OTHER PUBLICATIONS

Hastings, Alan, "The Art of Analog Layout," Second Edition, Prentice Hall (2006), pp. 173.

* cited by examiner

*Primary Examiner*—Chris Chu
(74) *Attorney, Agent, or Firm*—McDermott Will & Emery LLP

(57) ABSTRACT

It is an object of the present invention to surely protect a predetermined semiconductor element or a predetermined semiconductor element group in an analog block from a noise generated from a digital block. A semiconductor device according to the present invention includes a semiconductor substrate, a digital block to be a region in which a digital circuit is formed and an analog block to be a region in which an analog circuit is formed, arranged by separating an upper surface of the semiconductor substrate and a substrate potential fixing region provided on the semiconductor substrate so as to surround in a planar view the predetermined semiconductor element group in the analog block, and a pad connected to the substrate potential fixing region and receiving a predetermined potential from an external part.

4 Claims, 8 Drawing Sheets

SEMICONDUCTOR DEVICE

BACKGROUND OF THE INVENTION

1. Field of the Invention

The present invention relates to a semiconductor device in which an analog circuit and a digital circuit exist and more particularly, to a semiconductor device to protect an analog circuit from a noise generated from a digital circuit.

2. Description of the Background Art

As a semiconductor device such as an LSI becomes highly integrated and multifunctional recently, an analog circuit and a digital circuit are formed on the same semiconductor substrate, the same chip, for example. An electric signal generally used in the digital circuit has a large amount of signal variation and has a high frequency. As a result, when this affects the analog circuit through the same semiconductor substrate as a noise, the problem is that the precision of the analog circuit is likely to be lowered.

In order to protect the analog circuit from such noise, a semiconductor device in which a deep well is formed in a region of the analog circuit is proposed. Alternatively, as disclosed in Alan Hastings, "The Art of ANALOG LAYOUT", Second Edition, Person Prentice Hall, 2006, p. 173, a semiconductor device in which a substrate potential fixing region is formed between a digital circuit and an analog circuit is proposed. Thus, the analog circuit is protected from the noise by separating the digital circuit and the analog circuit.

However, when a semiconductor element in which a potential of its well cannot be fixed such as a parasitic bipolar, a well resistor, and a varactor, having an N type well as its terminal is formed in the analog circuit, the problem is that the semiconductor element is not sufficiently protected from the noise generated from the digital circuit and the precision of the analog circuit is lowered.

SUMMARY OF THE INVENTION

It is an object of the present invention to provide a semiconductor device capable of surely protecting a semiconductor element in an analog circuit, from a noise generated from a digital circuit.

A semiconductor device according to the present invention includes a semiconductor substrate, a digital block to be a region in which a digital circuit is formed, an analog block to be a region in which an analog circuit is formed, a substrate potential fixing region, and a pad. The digital block and the analog block are arranged by separating an upper surface of the semiconductor substrate. The substrate potential fixing region is provided on the semiconductor substrate so as to surround in a planar view a predetermined semiconductor element or a predetermined semiconductor element group in the analog block. The pad is connected to the substrate potential fixing region and receives a predetermined potential from an external part.

The predetermined semiconductor element or the predetermined semiconductor element group can be surely protected from a noise generated from the digital block.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
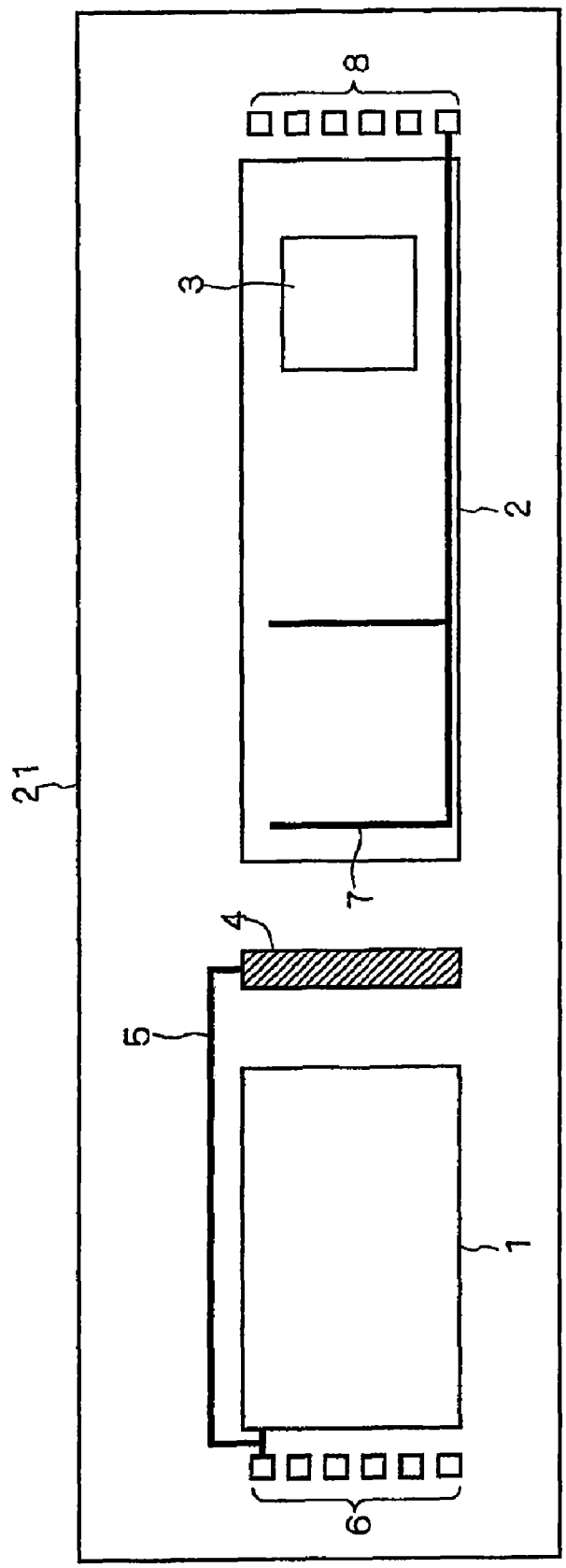
FIG. 1 is a top view showing a constitution of a conventional semiconductor device.
Figure 2:
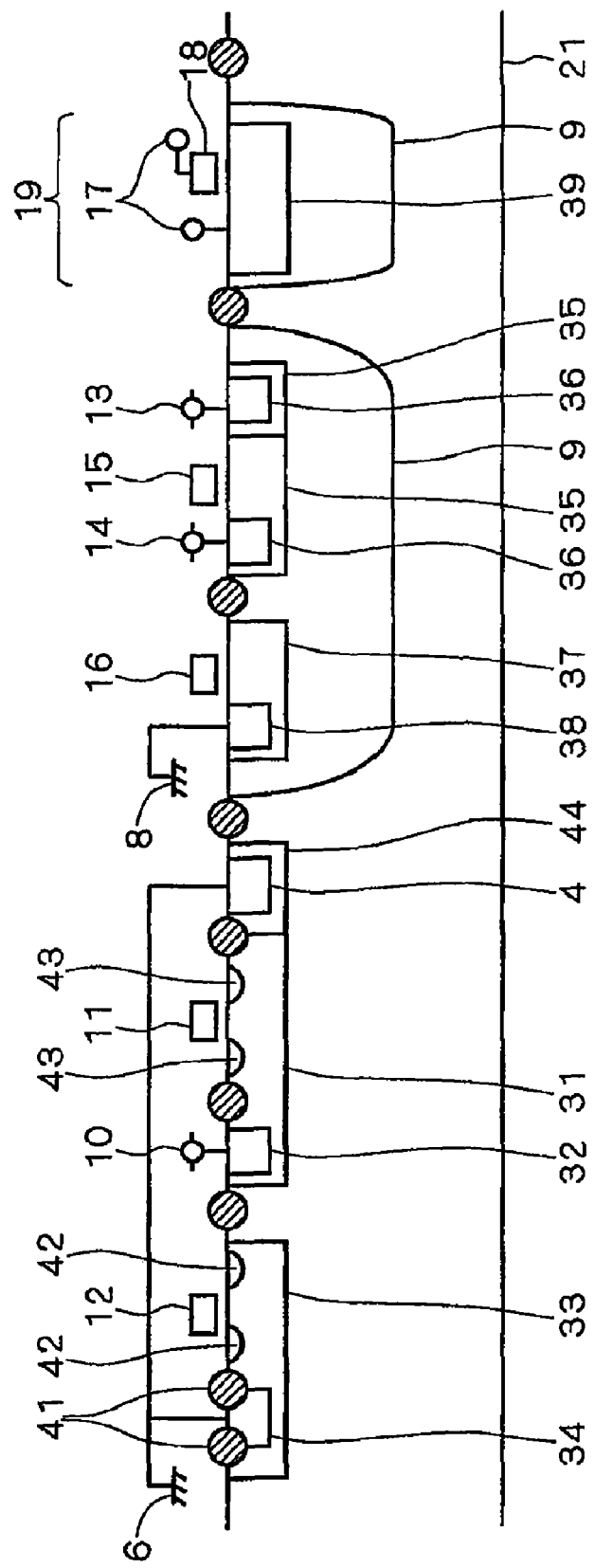
FIG. 2 is a sectional view showing the constitution of the conventional semiconductor device.

Before a semiconductor device according to this embodiment is described, a conventional semiconductor device will be described. FIG. 1 is a top view showing a constitution of a conventional semiconductor device, in which a region of each component is shown. FIG. 2 is a sectional view showing the constitution of the conventional semiconductor device. As shown in FIG. 1, the semiconductor device includes a semiconductor substrate 21, a digital block 1, an analog block 2, a substrate potential fixing region 4, and pads 6 and 8.

A semiconductor substrate 21 has a P type conductivity, for example. The digital block 1 shown in FIG. 1 is a region in which a digital circuit is formed, arranged by separating an upper surface of the semiconductor substrate 21. One of the pads 6 is connected to the digital circuit of the digital block 1 by a wiring 5. A ground potential is applied from an external part to the digital circuit of the digital block 1 through the pad 6.

As shown in FIG. 2, in the digital block 1, an N+ type conductive region 32 is surrounded by an N type well 31, and a P+ type conductive region 34 is surrounded by a P type well 33. The N type well 31 and the P type well 33 are separated by a separation element 41.

A gate 11 is formed above the N type well 31 and P type impurity diffusion regions 43 in which P type impurities are diffused are formed in the N type well 31 so as to sandwich the gate 11. One of the P type impurity diffusion regions 43 shown in the drawing is a source region and the other thereof is a drain region. Thus, a PMOS transistor having the gate 11 and the P type impurity diffusion regions 43 is formed in the digital block 1.

A gate 12 is formed above the P type well 33, and an N type impurity diffusion regions 42 in which N type impurities are diffused are formed in the P type well 33 so as to sandwich the gate 12. One of the N type impurity diffusion regions 42 shown in the drawing is a source region and the other thereof is a drain region. Thus, an NMOS transistor having the gate 12 and the P type impurity diffusion regions 42 is formed in the digital block 1.

The potentials of the semiconductor elements such as the PMOS transistor and the NMOS transistor formed in the digital block 1 are fixed to a potential 10 and the ground potential from the pad 6, respectively. In addition, although the semiconductor elements whose potentials are fixed to the potential 10 and the ground potential from the pad 6 as PMOS transistor and the NMOS transistor are formed, the present invention is not limited to this, and semiconductor element such as a polysilicon resistor may be formed.

The analog block 2 shown in FIG. 1 is a region in which an analog circuit is formed, arranged by separating an upper surface of the semiconductor substrate 21. One of the pads 8 is connected to the analog circuit of the analog block 2 by a wiring 7. A ground potential is applied from an external part to the analog circuit of the analog block 2 through the pad 8.

As shown in FIG. 2, in the analog block 2, an N+ type conductive region 36 is surrounded by an N type well 35, and a P+ type conductive region 38 is surrounded by a P type well 37. The N type well 35 and the P type well 37 are separated by the separation element 41.

A gate 15 is formed above the N type well 35. Thus, a polysilicon resistor having the gate 15 and the N type well 35 is formed in the analog block 2. Similarly, a gate 16 is formed above the P type well 37, and a polysilicon resistor having the gate 16 and the P type well 37 is formed in the analog block 2.

The semiconductor element formed in the analog block 2, the polysilicon resistors, for example is fixed to a potential 14 and the ground potential from the pad 8, respectively. In addition, although the semiconductor elements whose potentials are fixed to the potential 14 and the ground potential from the pad 8 as polysilicon resistors are formed, the present invention is not limited to this, and semiconductor element such as the NMOS transistor and the PMOS transistor like in the digital block 1 may be formed.

A predetermined semiconductor element group 3 is provided in the analog block 2 as shown in FIG. 1. In the predetermined semiconductor element group 3, a plurality of predetermined semiconductor elements are grouped with respect to each function. The predetermined semiconductor element is a semiconductor element in which a potential of its well cannot be fixed such as a parasitic bipolar, a well resistor and a capacitive element, a varactor, for example, having an N type well as a terminal. Here, such predetermined semiconductor element is a capacitive element 19 having an N type well 39 and a gate 18 each of which are connected to a terminal 17 as shown in FIG. 2.

As shown in FIG. 1, the substrate potential fixing region 4 is a conductive region provided in a planar view between the digital block 1 and the analog block 2 on the semiconductor substrate 21 and formed of P+ type conductive region, for example. The substrate potential fixing region 4 is connected to the pad 6 receiving the ground potential from the external part, through the wiring 5, and protects the semiconductor element and the capacitive element 19 which is included in the predetermined semiconductor element group 3 in the analog block 2 from a noise generated from the digital block 1. As shown in FIG. 2, according to this embodiment, the substrate potential fixing region 4 further has a P type well 44 under itself.

A deep well 9 shown in FIG. 2 is a conductive region provided in a region deeper than the region in which the semiconductor element and the capacitive element 19 in the analog block 2 are formed. The deep well 9 is formed of an N type conductive region, for example. The deep well 9 protects the semiconductor element and the capacitive element 19 in the analog block 2 from the noise generated from the digital block 1.

When the deep well 9 is formed in the vicinity of the semiconductor element in which the potential is fixed, the potential of the deep well 9 is fixed to a potential 13 as shown in FIG. 2. However, since the capacitive element 19 is the predetermined semiconductor element in which the potential of its well cannot be fixed, the potential of the deep well 9 cannot be fixed in the vicinity of the capacitive element 19. As a result, it is the problem that the capacitive element 19 cannot be sufficiently protected from the noise as compared with the semiconductor element in which the potential is fixed.

Figure 3:
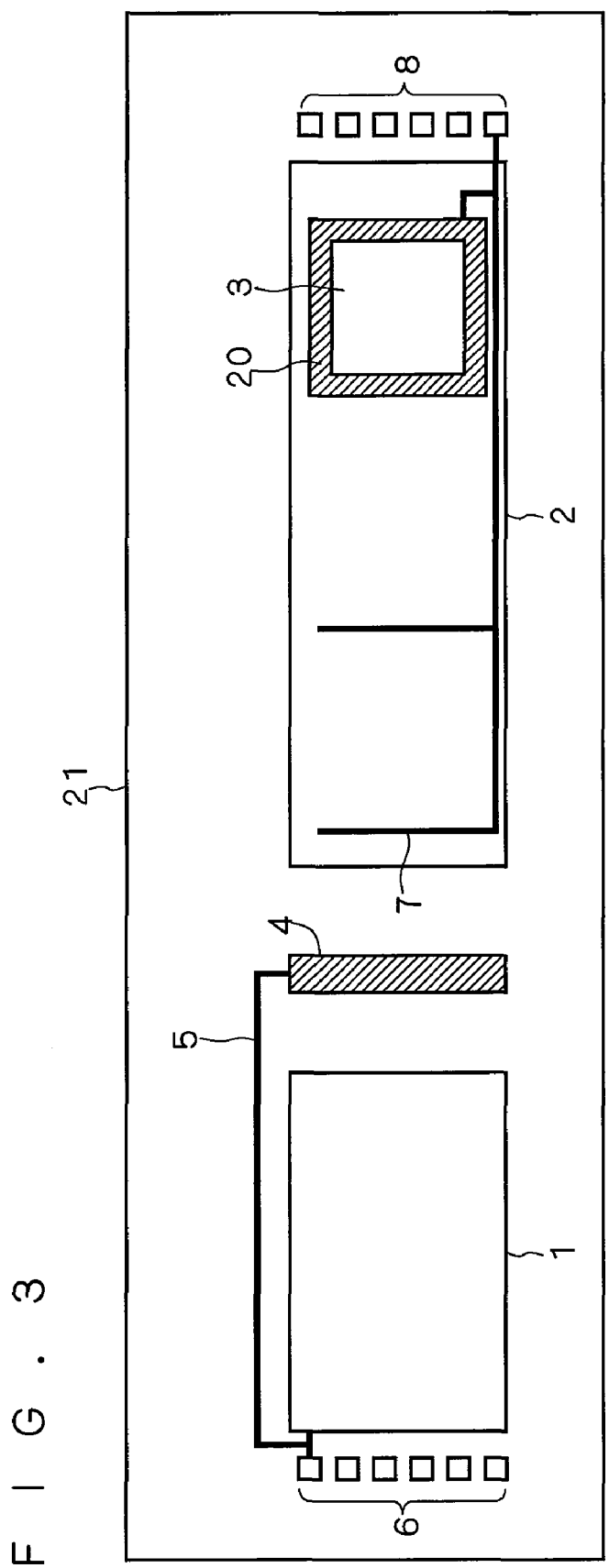
FIG. 3 is a top view showing a constitution of a semiconductor device according to a first embodiment.

The semiconductor device according to this embodiment is made to solve the above problem. The semiconductor device according to this embodiment will be described with reference to a top view in FIG. 3 and a sectional view in FIG. 4. As shown in FIG. 3, the semiconductor device according to this embodiment includes a semiconductor substrate 21, a digital block 1, an analog block 2, a substrate potential fixing region 4, pads 6 and 8 and further includes a substrate potential fixing region 20.

Figure 4:
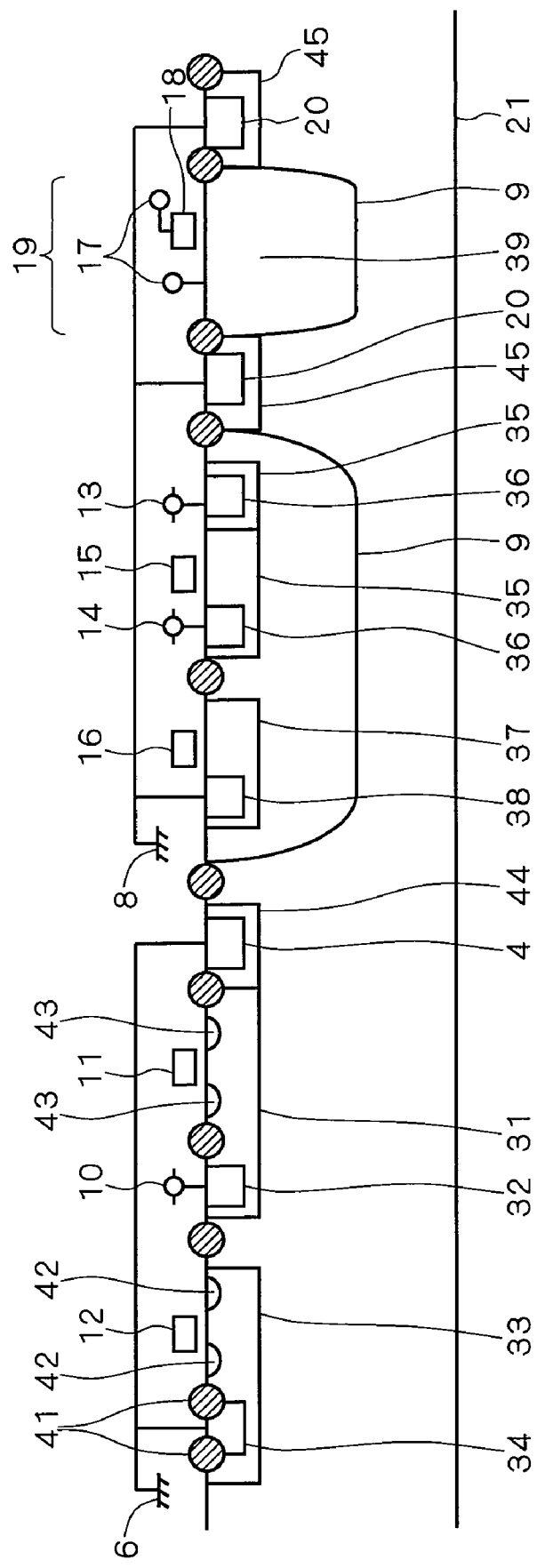
FIG. 4 is a sectional view showing the constitution of the semiconductor device according to the first embodiment.

As shown in FIG. 3, the substrate potential fixing region 20 is provided on the semiconductor substrate 21 so as to surround in a planar view a predetermined semiconductor element group 3 in the analog block 2. According to this embodiment, the substrate potential fixing region 20 is provided so as to surround in the planar view the whole four sides of the capacitive element 19 completely. The substrate potential fixing region 20 is a conductive region such as a P+ type conductive region. As shown in FIG. 4, according to this embodiment, the substrate potential fixing region 20 further includes a P type well 45 under itself.

A predetermined semiconductor element constituting the predetermined semiconductor element group 3 is a semiconductor element in which a potential of its well cannot be fixed such as a parasitic bipolar, a well resistor and a capacitive element, a varactor, for example, having an N type well as a terminal. The following description can be applied not only to the predetermined semiconductor element group 3 and when the predetermined semiconductor element constituting the predetermined semiconductor element group 3 has the same constitution, it can be also applied to the predetermined semiconductor element and the same effect as that in the following description can be obtained therefor. The following description will be made assuming that the predetermined semiconductor element which is included in the semiconductor element group 3 is the capacitive element 19 having an N type well 39 and a gate 18 each of which are connected to a terminal 17 as shown in the sectional view in FIG. 4.

One of the pads 8 is connected to the substrate potential fixing region 20 through a wiring 7, receiving a predetermined potential from an external part. According to this embodiment, as shown in FIGS. 3 and 4, such pad 8 is provided for applying the ground potential of the analog circuit of the analog block 2, and the wiring 7 is a ground wiring of the analog circuit.

In the analog circuit, the semiconductor element is arranged above a deep well 9 and the potential of the deep well 9 is fixed to improve resistance against the noise from the digital circuit. However, in the case where the N well itself is used as the terminal of the element such as the parasitic bipolar element and the N well resistor, since the potential cannot be fixed at such terminal, the potential of the deep well 9 also cannot be fixed. Meanwhile, according to the semiconductor device in this embodiment having the above constitution, the potential around the capacitive element 19 can be fixed to the ground potential of the analog circuit by the substrate potential fixing region 20. Thus, the noise generated from the digital block 1 can be absorbed in the ground potential of the analog circuit through the pad 8. Thus, the capacitive element 19 can be surely protected from the noise from the digital block 1. Especially, this is to be applied to a case where a parasitic bipolar that tends to amplify a noise is protected from the noise in a bandgap reference circuit.

In addition, in this embodiment, the deep well 9 is not provided in the digital block 1. However, the deep well 9 may be provided in the digital block 1, and in this case, the semiconductor element in the analog block 2 can be more protected from the noise.

In addition, when the capacitive element 19 in the analog block 2 is to be protected from the noise more, the capacitive element 19 and the pad 8 is to be provided apart from the digital block 1 as much as possible.

In addition, although the substrate potential fixing region 20 completely surrounds in the planar view all the four sides of the capacitive element 19 in this embodiment, the present invention is not limited to this and the substrate potential fixing region 20 may have an opening of about several tens of micrometers in view of a wiring. However, since the substrate potential fixing region 20 is provided for fixing the substrate potential of the analog circuit separately from the digital circuit to reduce the effect from the digital circuit, it is preferable that it does not have the opening and surrounds in the planar view the capacitive element 19 completely.

Second Embodiment

According to the first embodiment, the noise generated from the digital block 1 is absorbed in the ground potential of the analog circuit through the pad 8. However, in this case, the ground potential of the analog circuit fluctuates due to the noise to some extent. This could cause the precision of the analog circuit in which the potential is fixed to the ground to be lowered.

Figure 5:
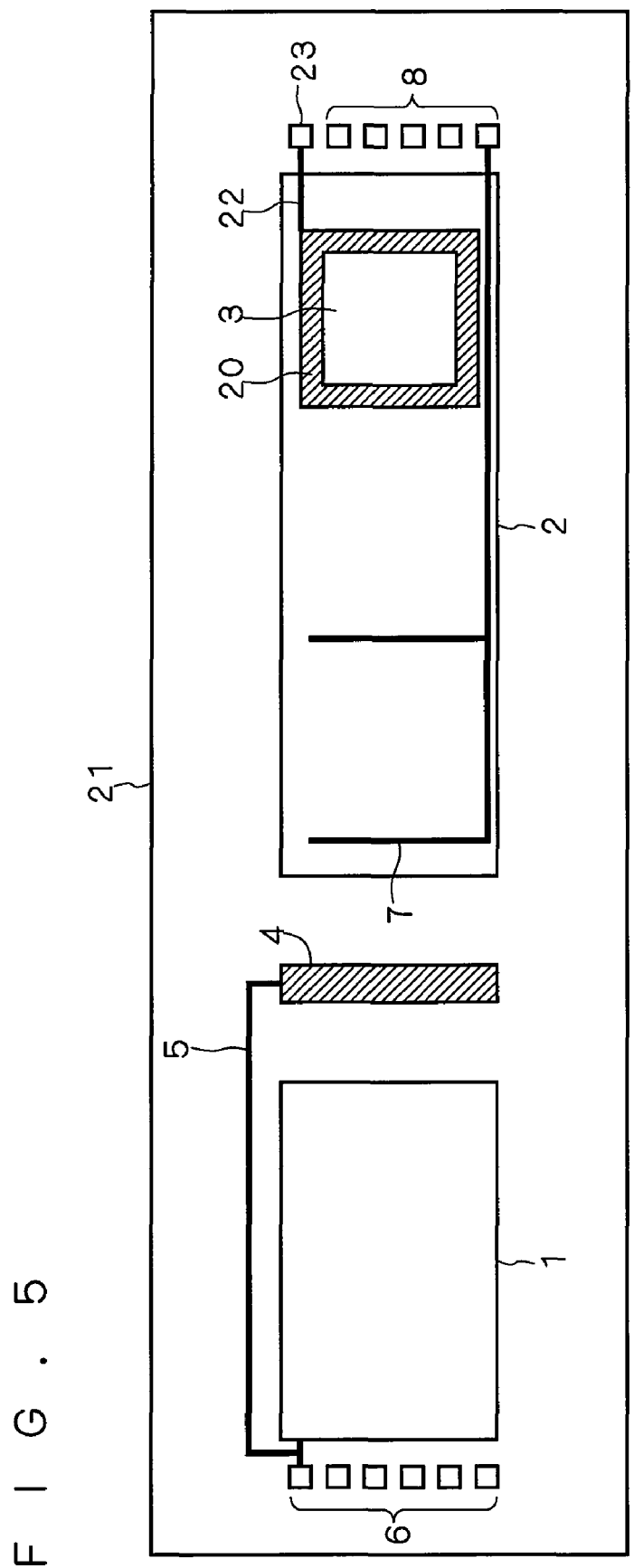
FIG. 5 is a top view showing a constitution of a semiconductor device according to a second embodiment.
Figure 6:
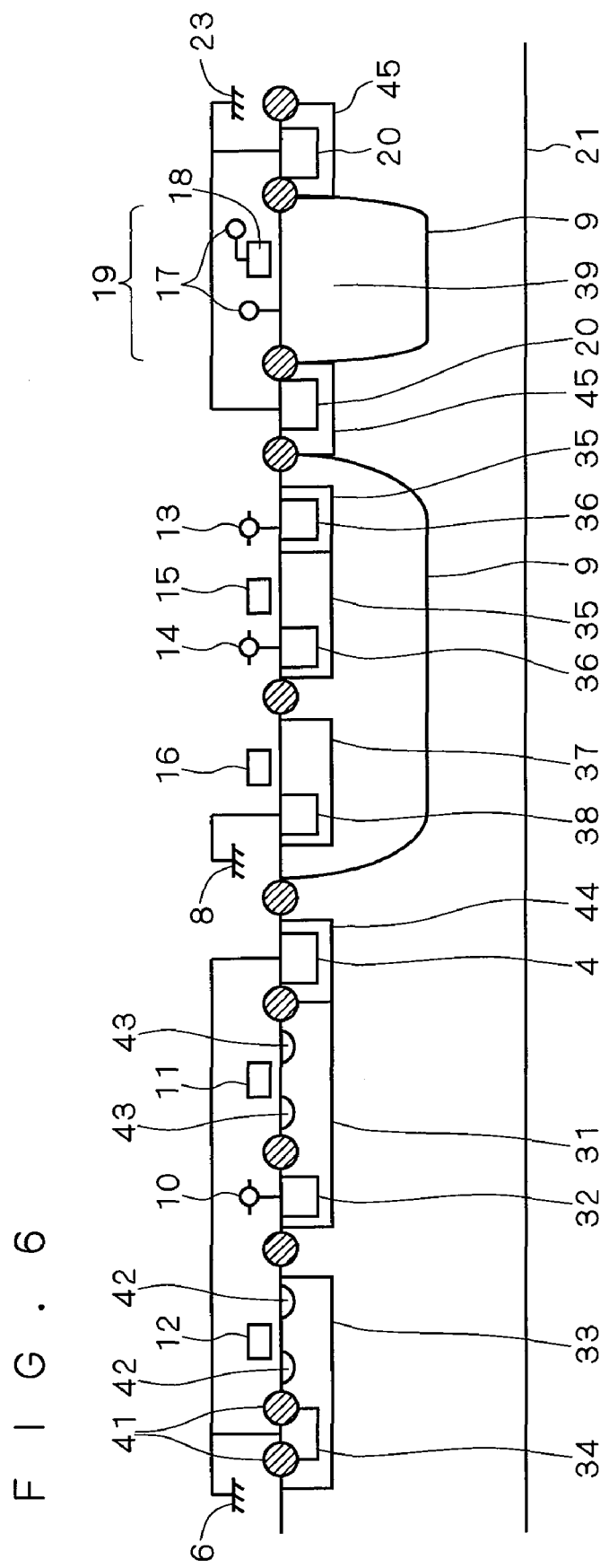
FIG. 6 is a sectional view showing the constitution of the semiconductor device according to the second embodiment.

A semiconductor device according to this embodiment, as shown in FIGS. 5 and 6, a pad 23 connected to a substrate potential fixing region 20 is used only for the substrate potential fixing region 20. Thus, the pad 23 is connected to the substrate potential fixing region 20 through a wiring 22 provided separately from a ground wiring 7. Here, it is assumed that the ground potential is applied to the pad 23 from an external part separately from the pad 8. Other constitutions are the same as those in the first embodiment.

According to the semiconductor device in this embodiment having the above constitution, since the ground potential independent of the substrate potential fixing region 20 can be applied to the analog circuit of the analog block 2, in addition to the effect of the first embodiment, the precision of the analog circuit is prevented from being lowered due to the ground potential fluctuation.

Third Embodiment

Figure 7:
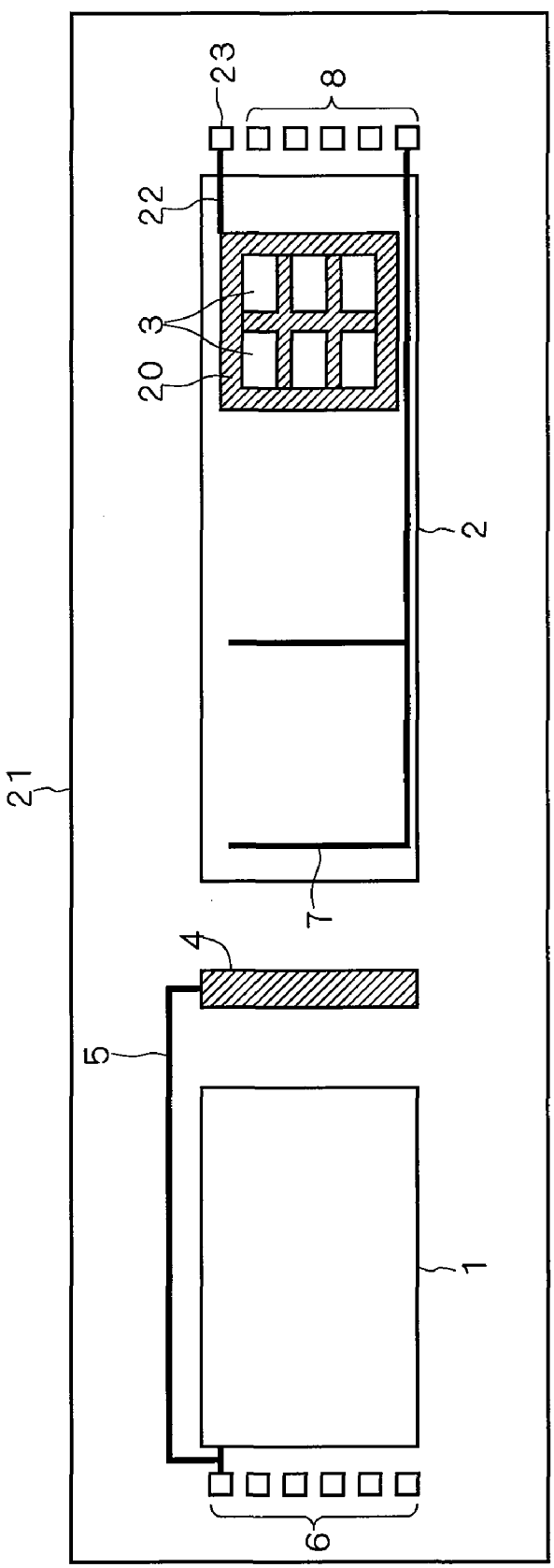
FIG. 7 is a top view showing a constitution of a semiconductor device according to a third embodiment.
Figure 8:
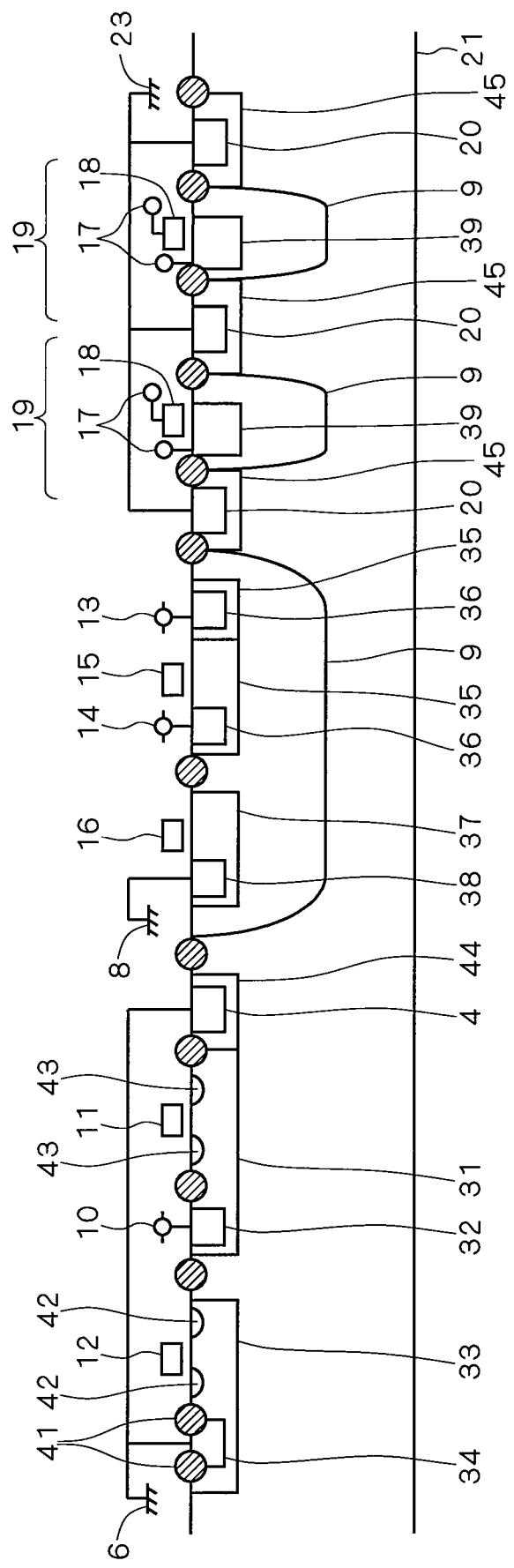
FIG. 8 is a sectional view showing the constitution of the semiconductor device according to the third embodiment.

According to this embodiment, as shown in FIG. 7, a predetermined semiconductor element group 3 is provided in an analog block 2. A plurality of predetermined semiconductor elements such as capacitive elements 19 are grouped in the semiconductor element group 3. According to a semiconductor device in this embodiment, in order to further protect the semiconductor element group 3 from a noise generated from a digital block 1, a substrate potential fixing region 20 surrounds in the planar view each capacitive element 19 which is included in the semiconductor element group 3 as shown in FIGS. 7 and 8. Other constitutions are the same as those in the first embodiment.

According to the semiconductor device formed as described above, each capacitive element 19 can be further surely protected from the noise generated from the digital block 1. In addition, in the case of recent fine processing, the problem is that when occupancy rate of the semiconductor element, that is, a ratio occupied by the semiconductor element varies with respect to each region, the characteristics of the semiconductor element also varies. However, according to the semiconductor device constituted as described above, even when a whole area of the semiconductor element group 3 is increased, the appropriate occupancy rate of the semiconductor element can be prevented from varying excessively by providing the substrate potential fixing region 20.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate;
   a digital block to be a region in which a digital circuit is formed;
   an analog block to be a region in which an analog circuit is formed, the digital block and the analog block arranged by separating an upper surface of said semiconductor substrate;
   a substrate potential fixing region provided on said semiconductor substrate so as to surround in a planar view a predetermined semiconductor element group or a predetermined semiconductor element in said analog block; and
   a pad connected to said substrate potential fixing region and receiving a predetermined potential from an external part.

2. The semiconductor device according to claim 1, wherein said pad applies a ground potential of said analog circuit.

3. The semiconductor device according to claim 1, wherein said pad is used only for said substrate potential fixing region.

4. The semiconductor device according to claim 1, wherein said substrate potential fixing region surrounds in a planar view each semiconductor element which is included in said semiconductor element group.

* * * * *